(12) United States Patent
Suzuki

(10) Patent No.: US 10,122,948 B2
(45) Date of Patent: Nov. 6, 2018

(54) SOLID-STATE IMAGE PICKUP ELEMENT AND IMAGE PICKUP APPARATUS

(71) Applicant: CANON KABUSHIKI KAISHA, Tokyo (JP)

(72) Inventor: Satoshi Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/381,840

(22) Filed: Dec. 16, 2016

(65) Prior Publication Data
US 2017/0187971 A1 Jun. 29, 2017

(30) Foreign Application Priority Data
Dec. 28, 2015 (JP) ................................. 2015-256094

(51) Int. Cl.
*H04N 5/355* (2011.01)
*H04N 5/353* (2011.01)
*H01L 27/146* (2006.01)
*H04N 5/3745* (2011.01)

(52) U.S. Cl.
CPC ... *H04N 5/35572* (2013.01); *H01L 27/14634* (2013.01); *H01L 27/14643* (2013.01); *H04N 5/3537* (2013.01); *H04N 5/37455* (2013.01)

(58) Field of Classification Search
CPC .... H04N 5/235; H04N 5/355; H04N 5/35572; H04N 5/3537; H04N 5/37455; H04N 5/2355; H04N 5/23232; H04N 5/35536; H01L 27/14643; H01L 27/14634; G06T 5/50
USPC ...................................................... 348/222.1
See application file for complete search history.

(56) References Cited

U.S. PATENT DOCUMENTS

| | | | | |
|---|---|---|---|---|
| 8,483,452 | B2 * | 7/2013 | Ueda ................... | H04N 5/2355 348/208.12 |
| 9,258,453 | B2 * | 2/2016 | Kato ................... | H04N 1/3871 |
| 9,544,506 | B1 * | 1/2017 | Wang ................... | H04N 5/2355 |
| 9,554,058 | B2 * | 1/2017 | Kim ..................... | H04N 5/2355 |
| 9,554,506 | B2 * | 1/2017 | Bittner ............... | A01M 7/0089 |
| 9,813,635 | B2 * | 11/2017 | Richards ............. | G06K 9/4642 |
| 2010/0140732 | A1 * | 6/2010 | Eminoglu ......... | H01L 27/14634 257/447 |
| 2011/0222793 | A1 * | 9/2011 | Ueda .................... | H04N 5/2355 382/284 |
| 2012/0249728 | A1 * | 10/2012 | Kato .................... | H04N 1/3871 348/36 |
| 2012/0262600 | A1 * | 10/2012 | Velarde ............... | H04N 5/2355 348/223.1 |
| 2013/0016253 | A1 * | 1/2013 | Kobayashi ......... | H04N 5/272 348/239 |
| 2013/0100314 | A1 * | 4/2013 | Li ....................... | H04N 5/2353 348/229.1 |
| 2013/0215290 | A1 * | 8/2013 | Solhusvik ........... | H04N 5/2355 348/231.99 |

(Continued)

FOREIGN PATENT DOCUMENTS

JP 63-306777 A 12/1988

*Primary Examiner* — Pritham Prabhakher
(74) *Attorney, Agent, or Firm* — Cowan, Liebowitz & Latman, P.C.

(57) ABSTRACT

A solid-state image pickup element includes an image signal combining part configured to combine a first image signal read from a pixel portion at a first timing, and a second image signal read from the pixel portion at a second timing, which is different from the first timing, to generate a third image signal.

12 Claims, 12 Drawing Sheets

(56) References Cited

U.S. PATENT DOCUMENTS

| | | | | |
|---|---|---|---|---|
| 2014/0016001 A1* | 1/2014 | Ichikawa | ............. | H04N 5/2353 |
| | | | | 348/229.1 |
| 2014/0218540 A1* | 8/2014 | Geiss | ................... | H04N 17/002 |
| | | | | 348/181 |
| 2015/0244917 A1* | 8/2015 | Huang | ................. | H04N 5/2353 |
| | | | | 348/222.1 |
| 2015/0296158 A1* | 10/2015 | Mansoorian | ........... | H04N 5/374 |
| | | | | 348/308 |
| 2017/0064179 A1* | 3/2017 | Richards | ............. | G06K 9/4642 |

* cited by examiner

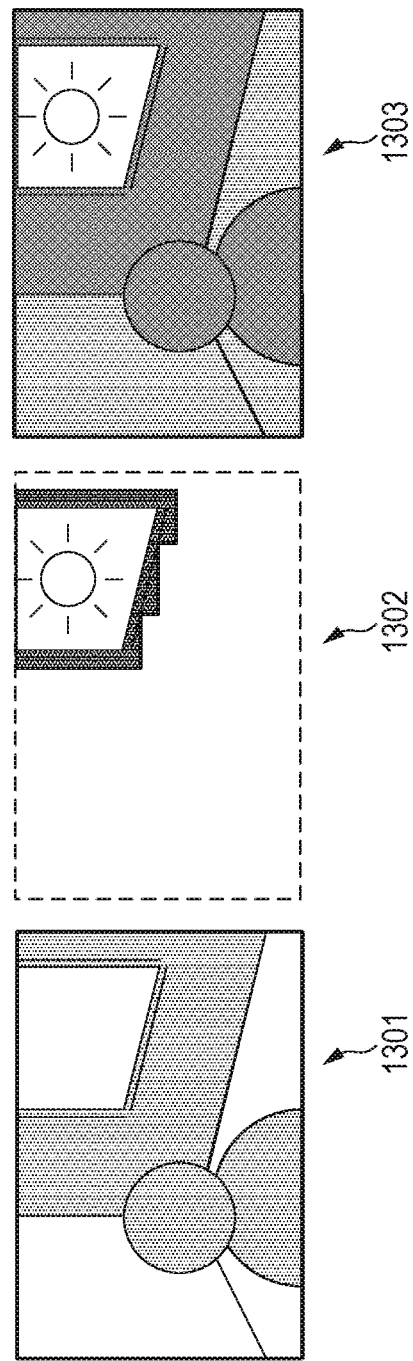

SOLID-STATE IMAGE PICKUP ELEMENT AND IMAGE PICKUP APPARATUS

BACKGROUND OF THE INVENTION

Field of the Invention

The present invention relates to a solid-state image pickup element and an image pickup apparatus.

Description of the Related Art

In recent years, there have been proposed a digital still camera, a digital video camera, and the like, which are capable of acquiring an image having a wide dynamic range. For example, in Japanese Patent Application Laid-Open No. S63-306777, there is described a technology in which an image having an appropriate brightness is segmented from a plurality of images with different exposure amounts, and those sectioned images are combined to generate an image having a wide dynamic range. The thus-generated image having the wide dynamic range is referred to as a high dynamic range (HDR) image. However, in the related art, there have been cases where the HDR image cannot always be acquired at high speed.

SUMMARY OF THE INVENTION

According to an aspect of an embodiment, there is provided a solid-state image pickup element, comprising: a pixel portion in which a plurality of pixels are arranged; an image signal combining part configured to combine a first image signal read from the pixel portion at a first timing, and a second image signal read from the pixel portion at a second timing, which is different from the first timing, to generate a third image signal; a signal level analysis part configured to analyze a signal level of the first image signal; and a controller configured to control the signal level of the first image signal and a signal level of the second image signal to be different from each other based on a result of the analysis of the first image signal by the signal level analysis part.

Further features of the present invention will become apparent from the following description of exemplary embodiments with reference to the attached drawings.

BRIEF DESCRIPTION OF THE DRAWINGS

FIG. 13A, FIG. 13B, and FIG. 13C are drawings for illustrating examples of images acquired during HDR photography by an image pickup apparatus according to the third embodiment.

DESCRIPTION OF THE EMBODIMENTS

Now, exemplary embodiments of the present invention are described with reference to the drawings.

First Embodiment

A solid-state image pickup element and an image pickup apparatus using the solid-state image pickup element according to a first embodiment of the present invention are described with reference to the drawings. An image pickup apparatus 309 according to this embodiment is configured to generate an HDR image by acquiring two images, that is, a first image and a second image under different photographic conditions, and combining those two images inside the solid-state image pickup element.

An "HDR image" is an image having a ratio between a minimum expressible luminance and a maximum expressible luminance that is higher than that of a normal image. In other words, an HDR image is an image having a dynamic range that is wider than that of a normal image. The "dynamic range" is a ratio between a minimum value and a maximum value of an identifiable signal. In other words, the dynamic range is a ratio between the minimum expressible luminance and the maximum expressible luminance. For example, the minimum value of the identifiable signal is a luminance level corresponding to a noise level of the solid-state image pickup element. Meanwhile, the maximum value of the identifiable signal is a luminance level corresponding to a saturated charge amount of a photoelectric converter provided in the solid-state image pickup element. As described later, when the first image, that is, a first image signal is acquired, photography is performed under preset photographic conditions. Meanwhile, as described later, when the second image, that is, a second image signal is acquired, photography is performed under such photographic conditions that a saturated portion of the first image signal is not saturated. In processing of combining the first image signal and the second image signal, that is, HDR combination, the saturated portion of the first image signal is replaced by the second image signal. Therefore, the image having the wide dynamic range, that is, the HDR image may be obtained.

Figure 1:
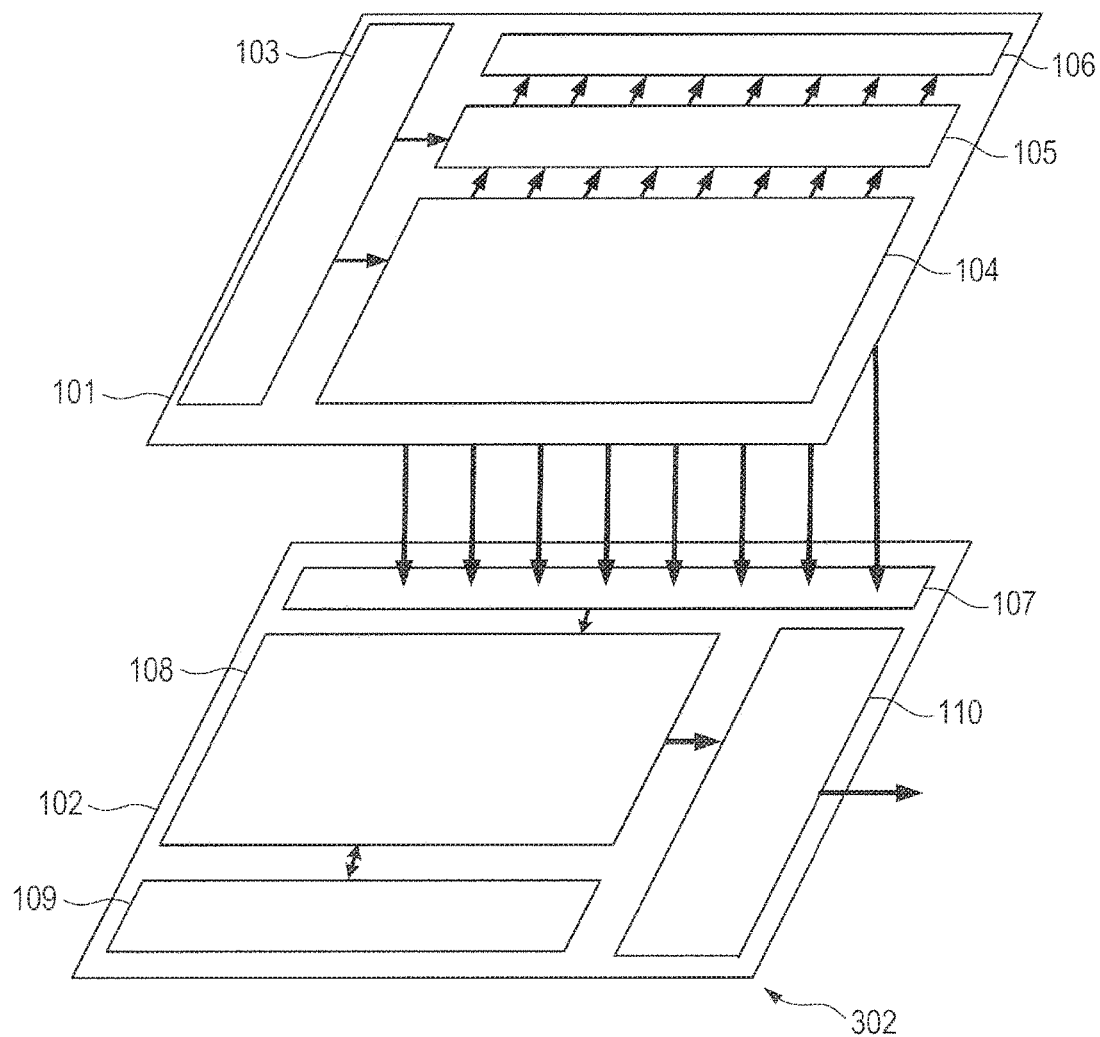
FIG. 1 is a schematic diagram for illustrating a solid-state image pickup element according to a first embodiment.

First, a configuration of the solid-state image pickup element according to this embodiment is described with reference to the drawings. FIG. 1 is a schematic diagram for illustrating the configuration of the solid-state image pickup element according to this embodiment. As illustrated in FIG. 1, a solid-state image pickup element 302 according to this embodiment has the structure in which a substrate 101 is laminated on a substrate 102.

The substrate 101 includes a light receiving portion 104, an analog-to-digital converter (A/D converter) 105, a connection portion 106, and a controller 103. The light receiving portion 104 is configured to receive light of an object image formed by an optical system 301 (see FIG. 4). In the light receiving portion 104, a plurality of pixels (unit pixels) 601 (see FIG. 2), each including a photoelectric converter (photoelectric conversion element) configured to convert light into electricity, are arranged two-dimensionally in a row direction and a column direction. The A/D converter 105 is configured to convert analog image signals (pixel signals), which are output from the unit pixels 601 arranged in the light receiving portion 104, into digital image signals. The connection portion 106 is configured to transfer the digital image signals, which are output from the A/D converter 105, to the substrate 102 side. The controller 103 is configured to control the light receiving portion 104 and the A/D converter 105. In the substrate 101, a peripheral circuit portion 606 (see FIG. 2) to be described later is also provided, but is omitted in FIG. 1.

The substrate 102 includes a connection portion 107, a signal processing unit 108, a memory 109, and an output part 110. The connection portion 107 is configured to receive the image signals from the substrate 101. The signal processing unit 108 is configured to perform various kinds of image processing, such as signal amplification, reference level adjustment, defect correction, and development processing, on the image signals from the substrate 101 or image signals from the memory 109. The signal processing unit 108 is also configured to combine a plurality of taken images to generate an HDR image. The memory 109 is configured to temporarily store the image signals from the signal processing unit 108. The output part 110 is configured to output the image signals, which are output from the signal processing unit 108, to the outside of the solid-state image pickup element 302.

The connection portion 106 provided to the substrate 101 and the connection portion 107 provided to the substrate 102 are electrically joined via microbumps or vias, for example. In this manner, the substrate 101 and the substrate 102 are electrically connected to each other.

In a related-art image pickup apparatus, a plurality of images have been acquired by the solid-state image pickup element 302, and the plurality of images have been combined by an image processing unit arranged outside the solid-state image pickup element 302 to generate an HDR image. Relatively long time is required to output image signals to the outside of the solid-state image pickup element 302. In addition, in order to generate the HDR image, the plurality of images have needed to be output to the outside of the solid-state image pickup element 302, and hence in the related-art image pickup apparatus, long time has been required to acquire the HDR image.

In contrast, in the solid-state image pickup element 302 according to this embodiment, the HDR image is generated in the signal processing unit 108 provided in the solid-state image pickup element 302. Therefore, in this embodiment, there is no need to output a plurality of image signals to the outside of the solid-state image pickup element 302. Therefore, according to this embodiment, there may be provided the solid-state image pickup element and the image pickup apparatus, which are capable of acquiring the HDR image at high speed.

Incidentally, when the output part 110 has multiple channels, the plurality of image signals may be output to the outside of the solid-state image pickup element 302 at relatively high speed. However, when the output part 110 has the multiple channels, the output part 110 is increased in scale, and also in power consumption. In this embodiment, there is no need for the output part 110 to have multiple channels, and hence there is no need to increase the number of terminals of the output part 110, to thereby contribute to reductions in size and power consumption of the solid-state image pickup element 302.

The time required to receive the light of the object image by the light receiving portion 104, perform the A/D conversion by the A/D converter 105, and perform the signal processing by the signal processing unit 108 is sufficiently small as compared to the time required to output one image signal to the outside by the output part 110.

Figure 2:
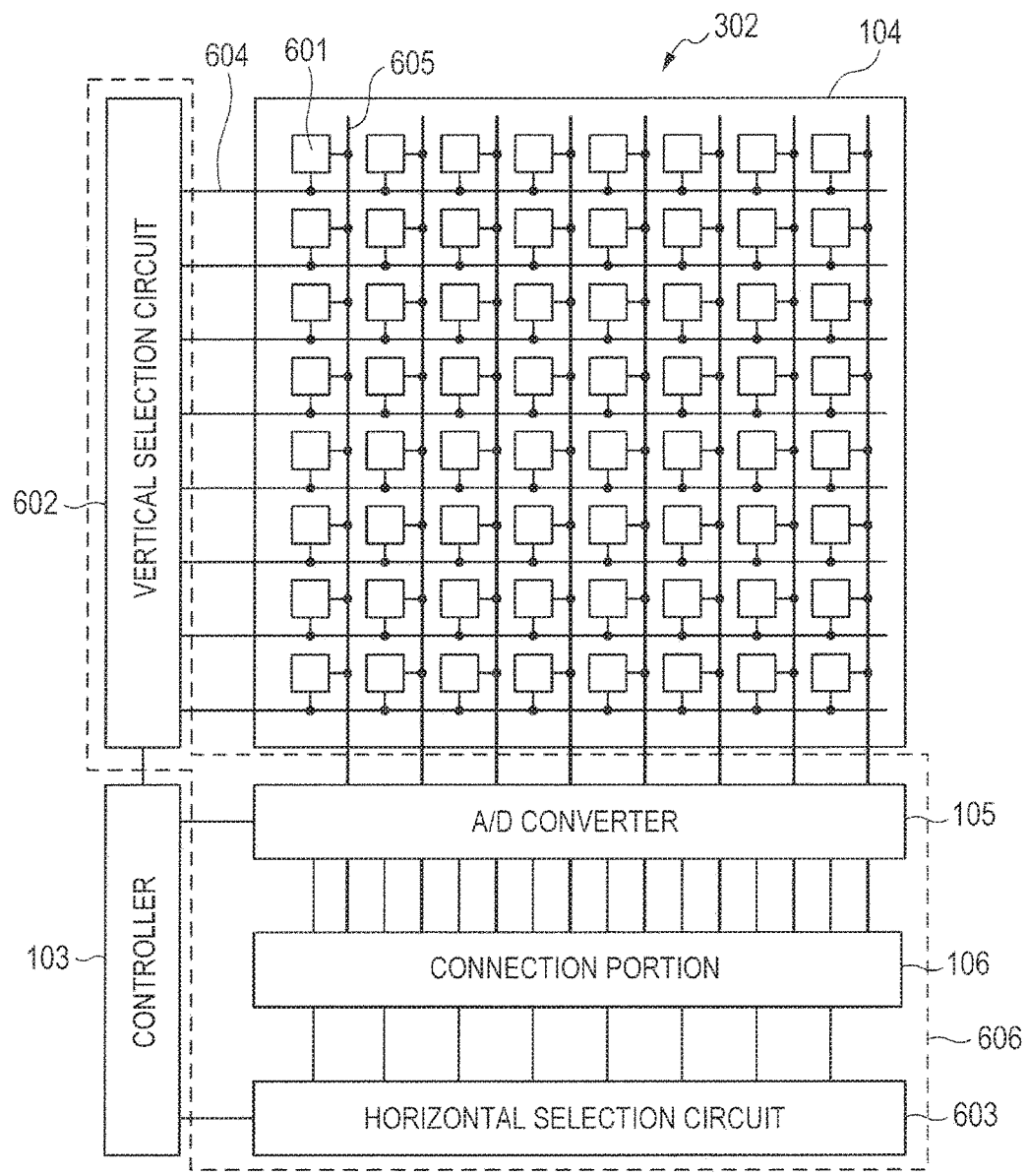
FIG. 2 is a circuit diagram for illustrating the solid-state image pickup element according to the first embodiment.

FIG. 2 is a circuit diagram for illustrating the solid-state image pickup element 302 according to this embodiment. In FIG. 2, a circuit on the substrate 101 side is illustrated. As illustrated in FIG. 2, in the light receiving portion (pixel portion) 104, the plurality of unit pixels 601 are arranged in matrix. The unit pixel 601 may be formed of one pixel or a plurality of divided pixels. When the unit pixel 601 is formed of the plurality of divided pixels, a photoelectric converter is provided to each of the divided pixels.

The peripheral circuit portion 606 includes a vertical selection circuit (row selection circuit) 602, the A/D converter 105, the connection portion 106, a horizontal selection circuit (column selection circuit) 603, driving signal lines 604, and vertical signal lines 605. To the vertical selection circuit 602, the driving signal lines 604 configured to supply driving signals (driving pulses) to the unit pixels 601 are connected. To the unit pixels 601 located in the same row, drive signals are supplied through a common driving signal line 604. In this example, for simplicity, one driving signal line 604 is illustrated for each row, but in reality, a plurality of driving signal lines 604 are arranged for each row. The unit pixels 601 located in the same column are connected to the same vertical signal line 605. A plurality of signals, that is, a plurality of pixel signals, which are respectively output from a plurality of unit pixels 601 located in rows selected by the vertical selection circuit 602, respectively pass through the plurality of vertical signal lines 605 to be collectively output to the A/D converter 105. Then, signals from unit pixels 601 located in columns selected by the horizontal selection circuit 603, which have been subjected to A/D conversion, are transferred to the substrate 102 via the connection portion 106.

The controller 103 is configured to control the vertical selection circuit 602 and the horizontal selection circuit 603 to select the unit pixels 601 from which signals are read. In FIG. 2, in order to simplify the description, unit pixels 601 in 8 rows by 8 columns are illustrated, but in reality, unit pixels 601 in several thousands of rows by several thousands of columns are arranged in the light receiving portion 104.

Figure 3:
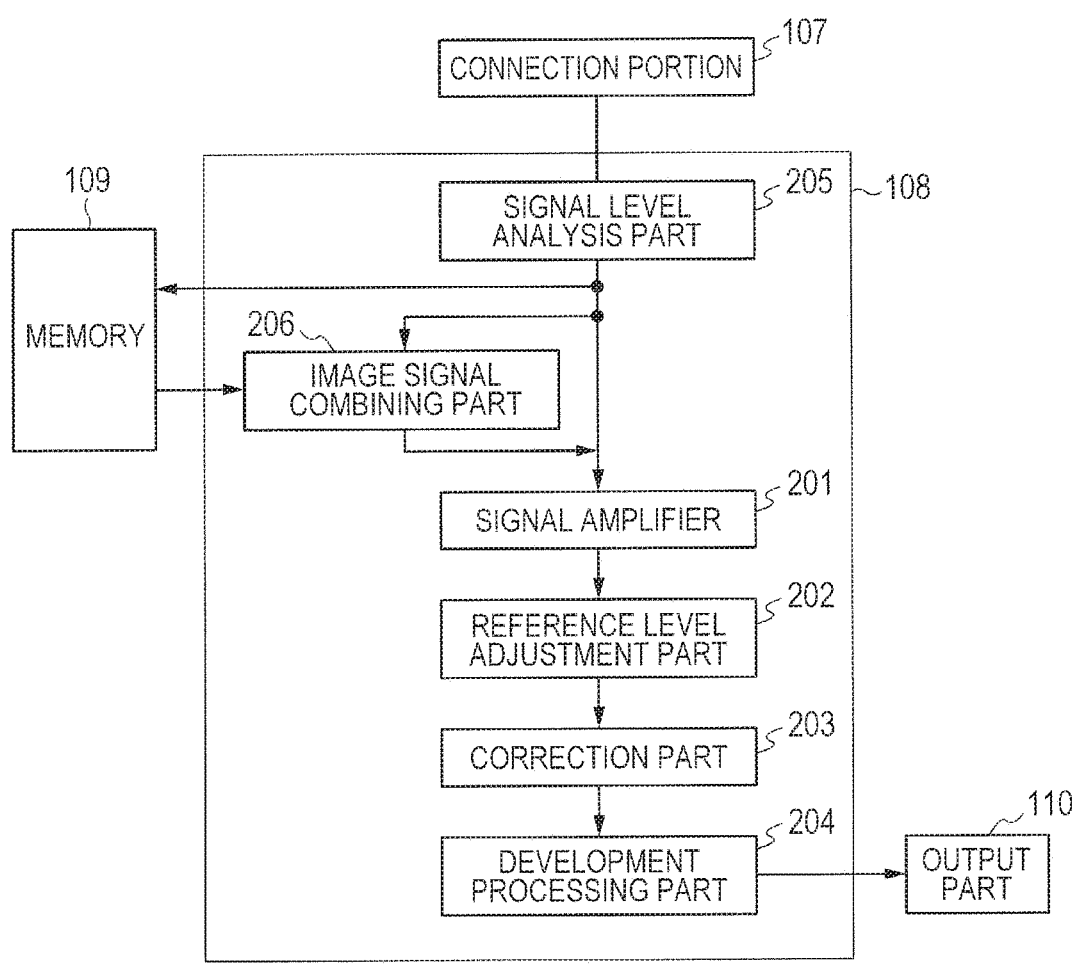
FIG. 3 is a block diagram for illustrating a signal processing unit of the solid-state image pickup element according to the first embodiment.

FIG. 3 is a block diagram for illustrating the signal processing unit 108 of the solid-state image pickup element 302 according to this embodiment. A signal level analysis part 205 is configured to analyze a signal level of an image signal input via the connection portion 107 for each pixel. Signals after being subjected to the photoelectric conversion by the light receiving portion 104 and the A/D conversion by the A/D converter 105 are input to the signal level analysis part 205 via the connection portion 107. An image signal combining part 206 is configured to combine the second image signal input from the light receiving portion 104 via the connection portion 107 and the first image signal held in the memory 109 to generate an HDR image. The first image signal held in the memory 109 is an image signal acquired in the last photography.

In combining signals of two images under different photographic conditions to generate the HDR image, that is, in performing HDR combination, the image signal combining part 206 also performs various kinds of processing generally performed in the HDR combination as appropriate. For example, when an object image shift occurs between the first image acquired in the first photography and the second image acquired in the second photography, image shift correction is performed. Specifically, feature points are extracted from both the first image signal and the second image signal to determine a shift amount in a vertical direction and a shift amount in a horizontal direction, which are required for the image shift correction. Then, the first image and the second image are combined while shifting coordinates based on the determined shift amounts. Such image shift correction is similarly applicable to a case where an image shift occurs due to a rotation between the first image and the second image. When a difference between a time of the first photography and a time of the second photography is extremely small, such image shift correction is not necessary. Depending on photographic situations, necessary correction may be performed as appropriate.

A signal amplifier 201 is configured to amplify, with a predetermined gain, the image signal input from the light receiving portion 104 via the connection portion 107 or signal of the HDR image obtained by the combination by the image signal combining part 206. A reference level adjustment part 202 is configured to adjust a level of image signal when no light enters the light receiving portion 104, that is, in a dark state to be a predetermined value. A correction part 203 is configured to perform various kinds of correction, such as defect correction and dark shading correction, on the image signal. A development processing part 204 is configured to perform white balance adjustment and other such processing, as well as development processing on the image signal. The image signal that has been subjected to the development processing by the development processing part 204 are output to the output part 110.

Figure 4:
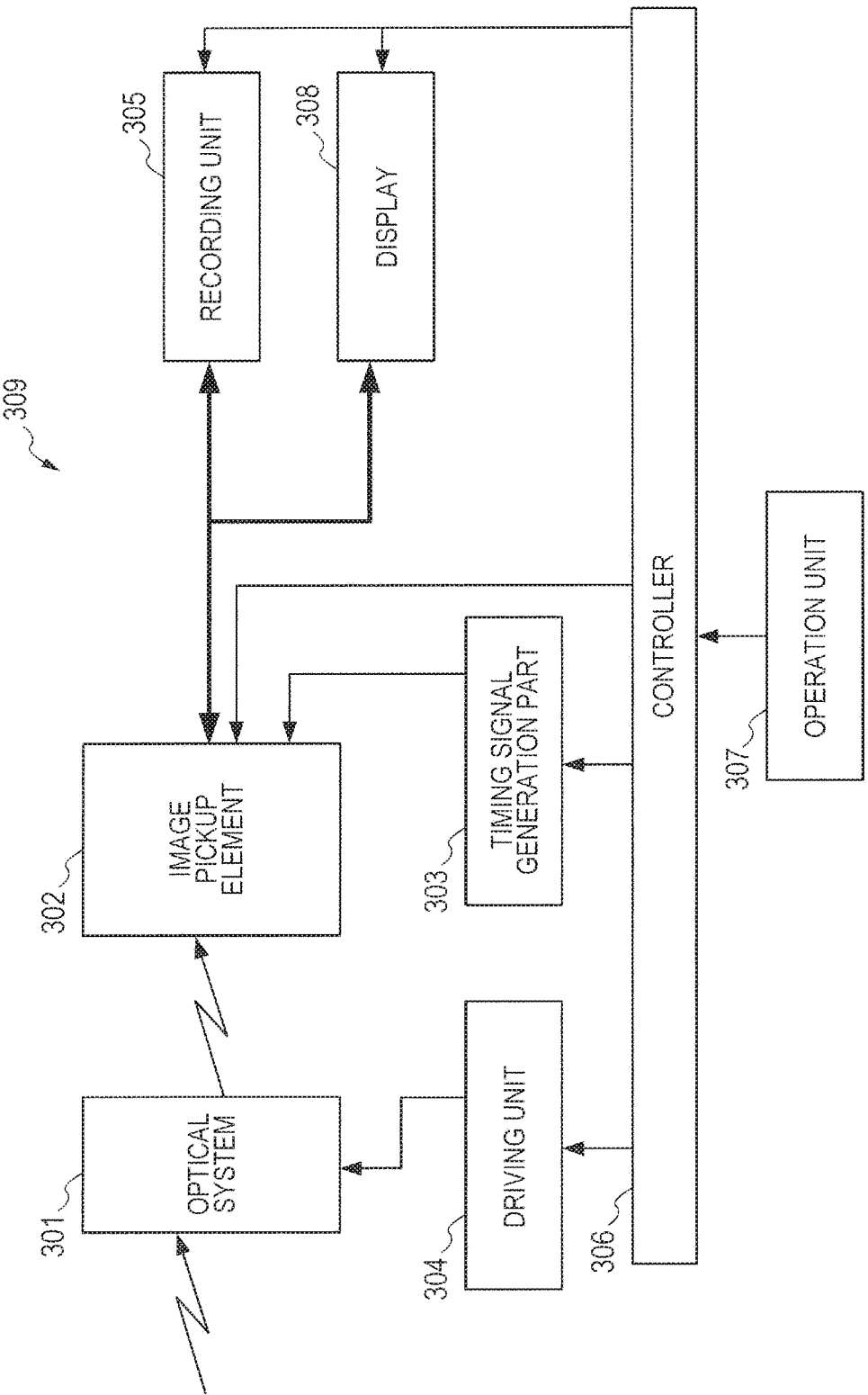
FIG. 4 is a block diagram for illustrating an image pickup apparatus according to the first embodiment.

FIG. 4 is a block diagram for illustrating the image pickup apparatus 309 according to this embodiment. An optical system 301 includes a photographing lens (not shown), a diaphragm (not shown), and the like. The photographing lens may be undetachable or detachable from a main body of the image pickup apparatus 309. The solid-state image pickup element 302 is configured to perform photoelectric conversion to convert an optical image that is input to an image pickup surface into electric signals. As described above, the solid-state image pickup element 302 is configured to subject the electric signals obtained by the photoelectric conversion to various kinds of image processing, such as signal amplification, reference level adjustment, defect correction, dark shading correction, and development processing, to generate an image signal. Moreover, as described above, the solid-state image pickup element 302 is configured to combine a plurality of taken images to generate an HDR image.

A timing signal generation part (timing signal generation circuit) 303 is configured to generate signals for operating the solid-state image pickup element 302. A driving unit 304 is configured to drive the optical system 301. A recording unit 305 is a recording medium for recording an image signal output from the solid-state image pickup element 302 and other such data, and specific examples thereof include a non-volatile memory and a memory card. A controller 306 is configured to control the entire image pickup apparatus 309, and specific examples thereof include a central processing unit (CPU). The controller 306 is configured to control the solid-state image pickup element 302, the timing signal generation part 303, the driving unit 304, and the like. An operation unit 307 includes an operation member (not shown) provided on the main body of the image pickup apparatus 309. The operation member is used by a user to operate the image pickup apparatus 309. The operation unit 307 is configured to output a signal corresponding to an operation of the operation member, which is performed by the user, to the controller 306. A display 308 is configured to display a taken image, a live view image, various setting screens, and the like.

Figure 5:
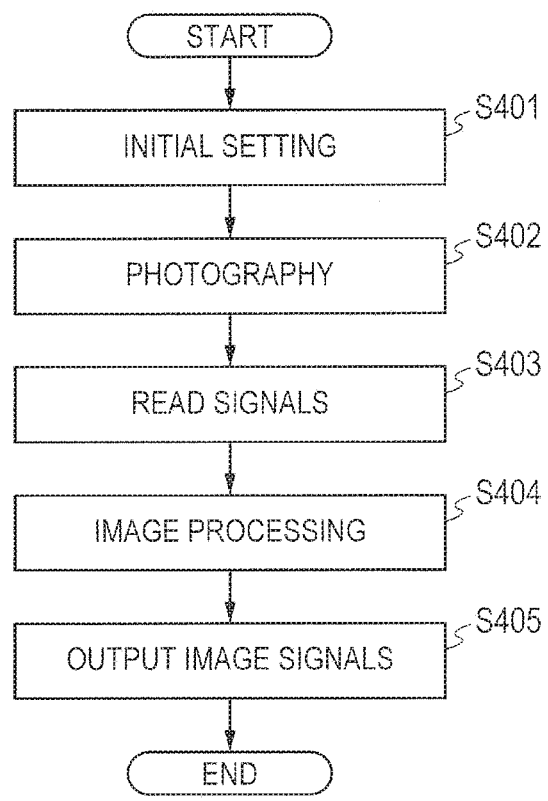
FIG. 5 is a flow chart for illustrating an operation during normal photography in the image pickup apparatus according to the first embodiment.

Next, an operation during normal photography of the image pickup apparatus 309 according to this embodiment is described with reference to FIG. 5. FIG. 5 is a flow chart for illustrating the operation during the normal photography of the image pickup apparatus 309 according to this embodiment. The "normal photography" as used herein means photography that is not HDR photography.

First, based on an instruction and the like issued by the user via the operation unit 307, initial setting of photographic conditions, such as sensitivity, an aperture value, and exposure time, is made (Step S401). Next, the optical system 301 and the like are controlled to perform photography using the solid-state image pickup element 302 (Step S402). Specifically, the light receiving portion 104 of the solid-state image pickup element 302 is exposed to light for a predetermined period of time. An analog image signal is generated by the photoelectric conversion performed in the light receiving portion 104, and the analog image signal is converted into a digital image signal by the A/D converter 105. Then, the thus-obtained digital image signal is read out to the signal processing unit 108 (Step S403).

Next, on the thus-read image signal, various kinds of signal processing are performed by the signal processing unit 108 (Step S404). Specifically, the signals are amplified by the signal amplifier 201, and a reference level is adjusted by the reference level adjustment part 202. Further, the defect correction and other such processing are performed by the correction part 203, and the white balance adjustment, development processing, and other such processing are performed by the development processing part 204. Next, the image signal output from the signal processing unit 108 is output to the recording unit 305 or the display 308, which is located outside the solid-state image pickup element 302, via the output part 110 (Step S405). This completes the normal photography.

Figure 6:
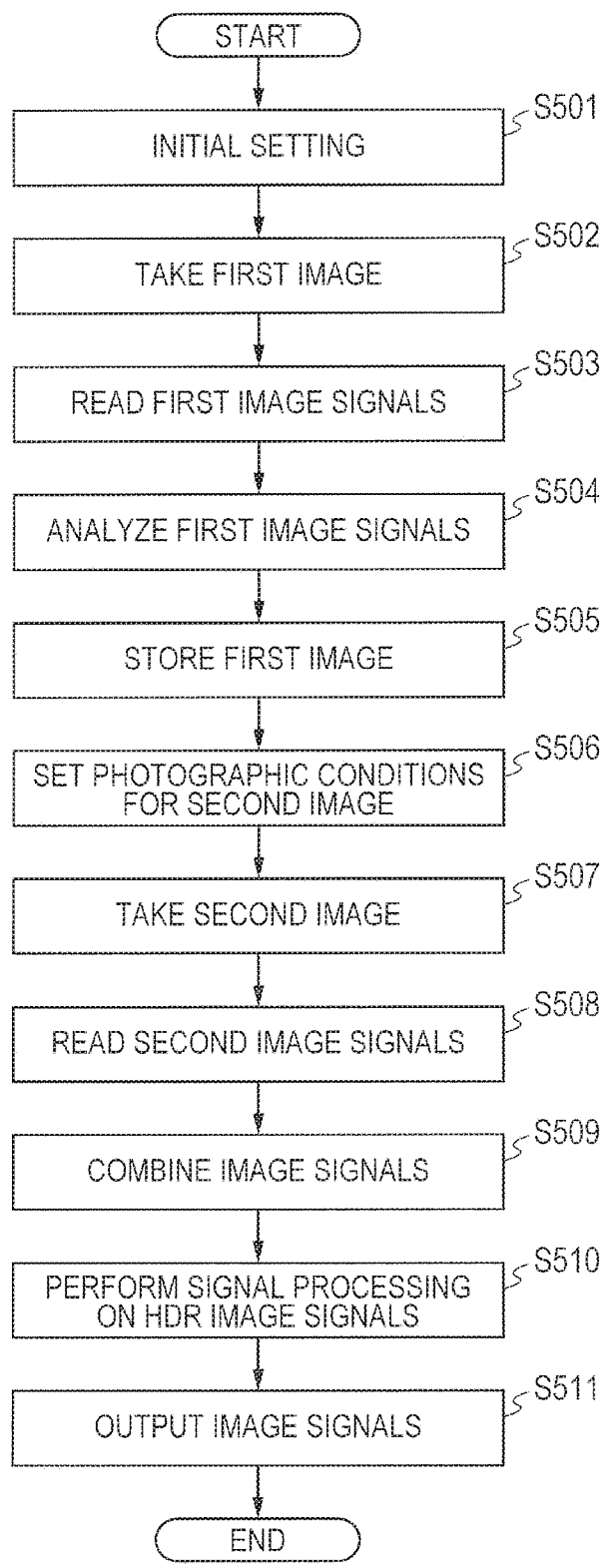
FIG. 6 is a flow chart for illustrating an operation during HDR photography in the image pickup apparatus according to the first embodiment.

Next, an operation during HDR photography of the image pickup apparatus 309 according to this embodiment is described with reference to FIG. 6. FIG. 6 is a flow chart for illustrating the operation during the HDR photography of the image pickup apparatus 309 according to this embodiment. In this embodiment, during the HDR photography, photography is performed two times under different photographic conditions, and more specifically, with different charge accumulation periods, and two images obtained by performing the photography two times are combined in the solid-state image pickup element 302 to generate an HDR image. The "charge accumulation period" refers to a period during which charges are accumulated in the unit pixels 601.

First, based on an instruction and the like issued by the user via the operation unit 307, initial setting of photographic conditions, such as sensitivity, an aperture value, and exposure time, is made (Step S501). Next, the optical system 301 and the like are controlled to perform the first photography, that is, photography for acquiring the first image, using the solid-state image pickup element 302 (Step S502). Specifically, the light receiving portion 104 of the solid-state image pickup element 302 is exposed to light for a predetermined period of time to acquire the first image, that is, the first image signal. An analog image signal is generated by the photoelectric conversion performed in the light receiving portion 104, and the analog image signal is converted into a digital image signal by the A/D converter 105. The thus-obtained digital image signal is read out as the first image signal by the signal processing unit 108 (Step S503). The first image signal is analyzed in terms of signal level for each pixel by the signal level analysis part 205 provided in the signal processing unit 108 (Step S504), and is then held in the memory 109 (Step S505).

Next, based on an analysis result of the first image signal by the signal level analysis part 205, photographic conditions for acquiring the second image are set (Step S506). Specifically, based on a result of the analysis of the first image signal by the signal level analysis part 205, photographic conditions for acquiring a second image signal are set. Specifically, a charge accumulation period for acquiring the second image signal is set. Such setting of the charge accumulation period is made by the controller 103. The charge accumulation period may be set as appropriate by controlling switches, which are provided to the unit pixels 601, as appropriate, for example. For example, when a range of a level of the first image signal is relatively wide, the charge accumulation period for acquiring the second image signal is set so that a difference between the charge accumulation period that has been used in acquiring the first image signal and the charge accumulation period to be used in acquiring the second image signal may become relatively larger. Meanwhile, when the range of the signal level of the first image signal is relatively narrow, the charge accumulation period for acquiring the second image signal is set so that the difference between the charge accumulation period that has been used in acquiring the first image signal and the charge accumulation period to be used in acquiring the second image signal may become relatively smaller.

Setting of the photographic conditions for acquiring the second image is not limited to the setting of the charge accumulation period. For example, when a gain may be set in the A/D converter 105, the setting of the charge accumulation period and the setting of the gain in the A/D converter 105 may be combined to set the photographic conditions for acquiring the second image. Examples of the A/D converter 105 capable of setting the gain include an A/D converter 105 including an analog signal amplifier configured to multiply the analog signals, which are input to the A/D converter 105, by a predetermined gain. Examples of the A/D converter 105 capable of setting the gain also include an A/D converter including a digital signal amplifier configured to multiply digital signals after the A/D conversion by a predetermined amount of gain. For example, when a range of the signal level of the first image signal is relatively wide, the gain and the charge accumulation period for acquiring the second image signal are set so that a difference between the signal level of the first image signal and signal level of the second image signal may become relatively larger. Meanwhile, when the range of the signal level of the first image signal is relatively narrow, the gain and the charge accumulation period for acquiring the second image signal are set so that the difference between the signal level of the first image signal and the signal level of the second image signal may become relatively smaller.

Moreover, the A/D converter 105 may be a single-slope A/D converter. The single-slope A/D converter is an A/D converter using a comparator (not shown) and a counter (not shown). In the single-slope A/D converter, a ramp signal is generated inside the A/D converter. The comparator provided in the A/D converter is configured to compare a pixel signal from a unit pixel 601 and the ramp signal, and time until the comparator is inverted is counted by the counter. A magnitude of the ramp signal corresponding to the time counted by the counter is a magnitude of the pixel signal. Therefore, in the single-slope A/D converter, based on the time counted by the counter, the magnitude of the pixel signal may be determined. In the single-slope A/D converter, reducing an amount of change of the magnitude of the ramp signal per unit time, that is, a slope of the ramp signal corresponds to increasing the gain to be multiplied to the input signals. Meanwhile, in the single-slope A/D converter, increasing the amount of change of the magnitude of the ramp signal per unit time, that is, the slope of the ramp signal corresponds to reducing the gain to be multiplied to the input signals. Therefore, when the A/D converter 105 is the single-slope A/D converter, the slope of the ramp signal may be adjusted to adjust the gain in the A/D converter 105. For example, when a range of the signal level of the first image signal is relatively wide, the slope of the ramp signal and the charge accumulation period for acquiring the second image signal are set so that a difference between the signal level of the first image signal and the signal level of the second image signal may become relatively larger. Meanwhile, when the range of the signal level of the first image signal is relatively narrow, the slope of the ramp signal and the charge accumulation period for acquiring the second image signal are set so that the difference between the signal level of the first image signal and the signal level of the second image signal may become relatively smaller.

Next, based on the photographic conditions set in Step S506, photography for acquiring the second image signal is performed using the solid-state image pickup element 302 (Step S507). Specifically, the light receiving portion 104 of the solid-state image pickup element 302 is exposed to light to acquire the second image signal. Analog image signals are generated by the photoelectric conversion performed in the light receiving portion 104, and the analog image signals are converted into digital image signals by the A/D converter 105. Then, the thus-obtained digital image signals are read out as the second image signal by the signal processing unit 108 (Step S508). The first image signal is already read in Step S503, and a timing when the second image signal is read is different from a timing when the first image signal is read.

Next, the thus-obtained second image signal and the first image signal held in the memory 109 are combined by the image signal combining part 206, to thereby generate an HDR image signal (Step S509). Next, various kinds of signal processing are performed on the thus-obtained HDR image signal (Step S510). Specifically, the signals are amplified by the signal amplifier 201, and a reference level is adjusted by the reference level adjustment part 202. Further, the defect correction is performed by the correction part 203, and the white balance adjustment, development processing, and other such processing are performed by the development processing part 204. Next, the image signals output from the signal processing unit 108 are output to the recording unit 305 or the display 308, which is located outside the solid-state image pickup element 302, via the output part 110 (Step S511). This completes the photography of the HDR image.

Figure 7A:
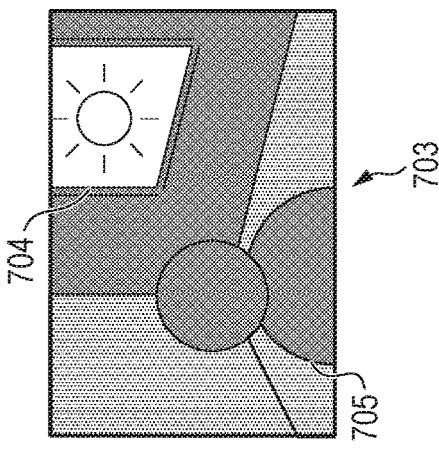
FIG. 7A, FIG. 7B, and FIG. 7C are drawings for illustrating examples of images acquired during the HDR photography by the image pickup apparatus according to the first embodiment.
Figure 7B:
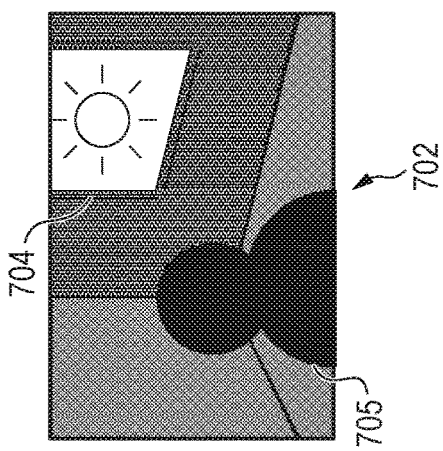
Figure 7C:
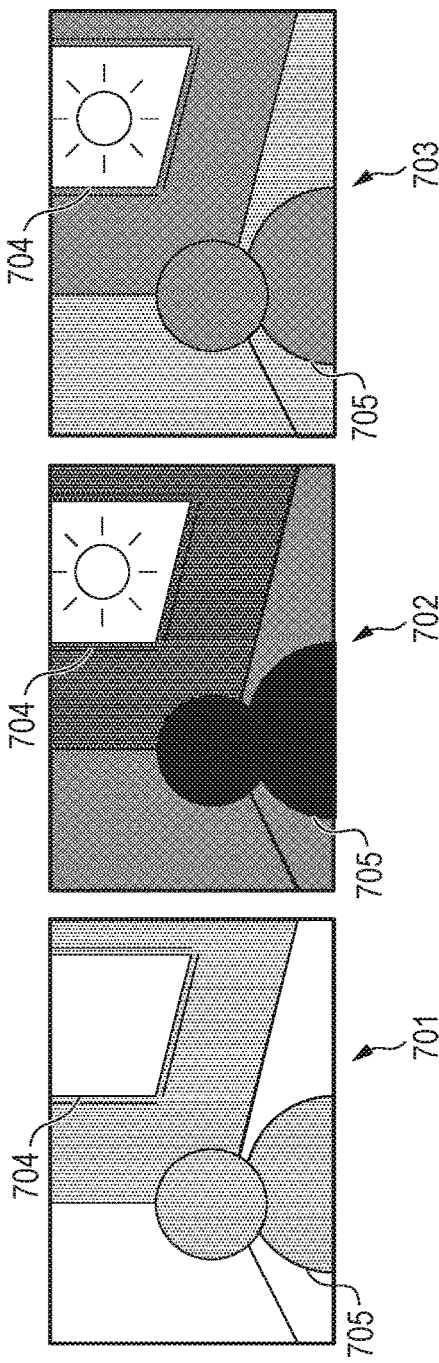

FIG. 7A to FIG. 7C are drawings for illustrating examples of images acquired during the HDR photography by the image pickup apparatus 309 according to this embodiment. In FIG. 7A, there is illustrated an example of a first image 701, that is, an image acquired in the first photography, and in FIG. 7B, there is illustrated an example of a second image 702, that is, an image acquired in the second photography. In FIG. 7C, there is illustrated an example of an HDR image 703, that is, an image obtained by combining the first image 701 and the second image 702.

The first image 701 illustrated in FIG. 7A is acquired under the initially-set photographic conditions. In the first image 701, a portion having a relatively high luminance reaches a saturation level. Specifically, the portion inside a window frame 704 reaches the saturation level. In the portion reaching the saturation level, image information is lost.

The second image 702 illustrated in FIG. 7B is acquired under such photographic conditions that the portion reaching the saturation level in the first image 701 does not reach the saturation level. In the second image 702, image information exists also in the portion having the relatively high luminance. Specifically, in the second image 702, the image information exists also in the portion inside the window frame 704. Meanwhile, in a portion having a low luminance, image signals are in a state close to a black level. Specifically, in the portion of a person 705, the image signals are in the state close to the black level, and the person 705 is difficult to recognize.

The HDR image 703 illustrated in FIG. 7C is obtained by combining the first image 701 illustrated in FIG. 7A and the second image 702 illustrated in FIG. 7B. In the HDR image 703 illustrated in FIG. 7C, sufficient information exists both in the portion having the relatively high luminance and in the portion having the relatively low luminance. In other words, in the HDR image 703 illustrated in FIG. 7C, object information is sufficiently reflected both on the portion inside the window frame 704 and on the portion of the person 705.

As described above, according to this embodiment, the HDR image is generated in the solid-state image pickup element 302, and hence there is no need to output a plurality of images for generating the HDR image to the outside of the solid-state image pickup element 302. Therefore, according to this embodiment, there may be provided the solid-state image pickup element and the image pickup apparatus, which are capable of acquiring the HDR image at high speed.

Second Embodiment

A solid-state image pickup element and an image pickup apparatus according to a second embodiment of the present invention are described with reference to the drawings. Components like those of the solid-state image pickup element and the image pickup apparatus according to the first embodiment, which are illustrated in FIG. 1 to FIG. 7C, are denoted by like reference symbols, and a description thereof is omitted or briefly made.

The solid-state image pickup element 302 and the image pickup apparatus 309 according to this embodiment are configured to limit a reading area for acquiring the second image signal based on the analysis result of the first image signal, to thereby reduce reading time in acquiring the second image signal. The reading time in acquiring the second image signal is reduced, and hence time required to generate an HDR image may further be reduced.

Basic configurations of the solid-state image pickup element 302 and the image pickup apparatus 309 according to this embodiment are similar to the basic configurations of the solid-state image pickup element 302 and the image pickup apparatus 309 according to the first embodiment, which have been described above with reference to FIG. 1 to FIG. 4.

Figure 8A:
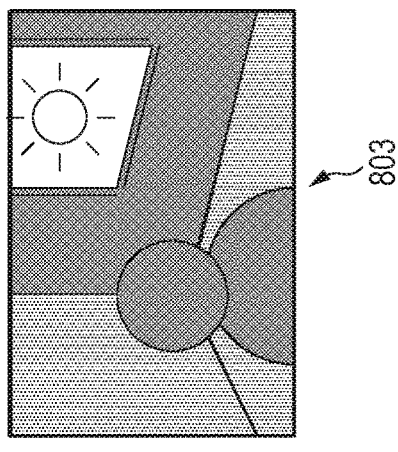
FIG. 8A, FIG. 8B, and FIG. 8C are drawings for illustrating examples of images acquired during HDR photography by an image pickup apparatus according to a second embodiment.
Figure 8B:
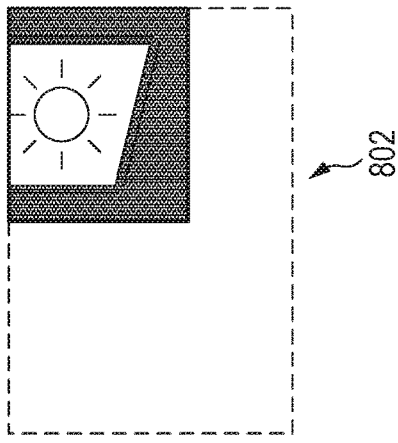
Figure 8C:
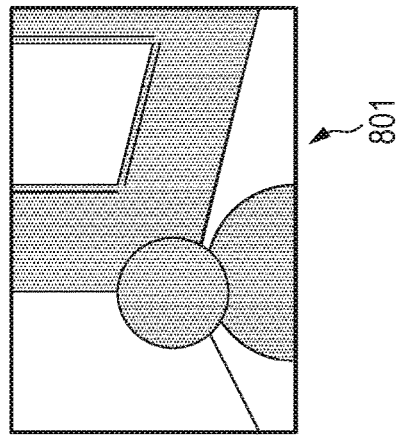

FIG. 8A to FIG. 8C are drawings for illustrating examples of images acquired during the HDR photography by the image pickup apparatus 309 according to this embodiment. In FIG. 8A, there is illustrated an example of a first image 801, that is, the image 801 acquired in the first photography, and in FIG. 8B, there is illustrated an example of a second image 802, that is, the image 802 acquired in the second photography. In FIG. 8C, there is illustrated an example of an HDR image 803, that is, an image obtained by combining the first image 801 and the second image 802.

The first image 801 illustrated in FIG. 8A is an image acquired under initially-set photographic conditions, and is similar to the first image 701 in the first embodiment, which has been described above with reference to FIG. 7A.

The second image 802 illustrated in FIG. 8B is an image acquired under such photographic conditions that a portion reaching a saturation level in the first image 801 illustrated in FIG. 8A does not reach the saturation level. In this embodiment, when a second image signal is acquired, it is not that signals from all unit pixels 601 arranged in the light receiving portion 104 are read, but that signals are read only from unit pixels 601 located in a partial region of the light receiving portion 104. Specifically, only signals from unit pixels 601 located in a region including a region having signal levels reaching the saturation level in the first image 801 illustrated in FIG. 8A and a surrounding region thereof are read when the second image is acquired. According to this embodiment, the signals are read only from the unit pixels 601 located in the partial region of the light receiving portion 104. Therefore, the time required to read the second image may be reduced, and hence the HDR image may be acquired at higher speed.

The HDR image 803 illustrated in FIG. 8C is the image obtained by combining the first image 801 illustrated in FIG. 8A and the second image 802 illustrated in FIG. 8B. For the region including the region having the signal levels reaching the saturation level in the first image 801 and the surrounding region thereof, image signals are generated by combining the first image 801 and the second image 802. Meanwhile, for regions other than the region, image signals are generated by multiplying image signals of the first image 801 by an appropriate gain or the like.

Figure 9:
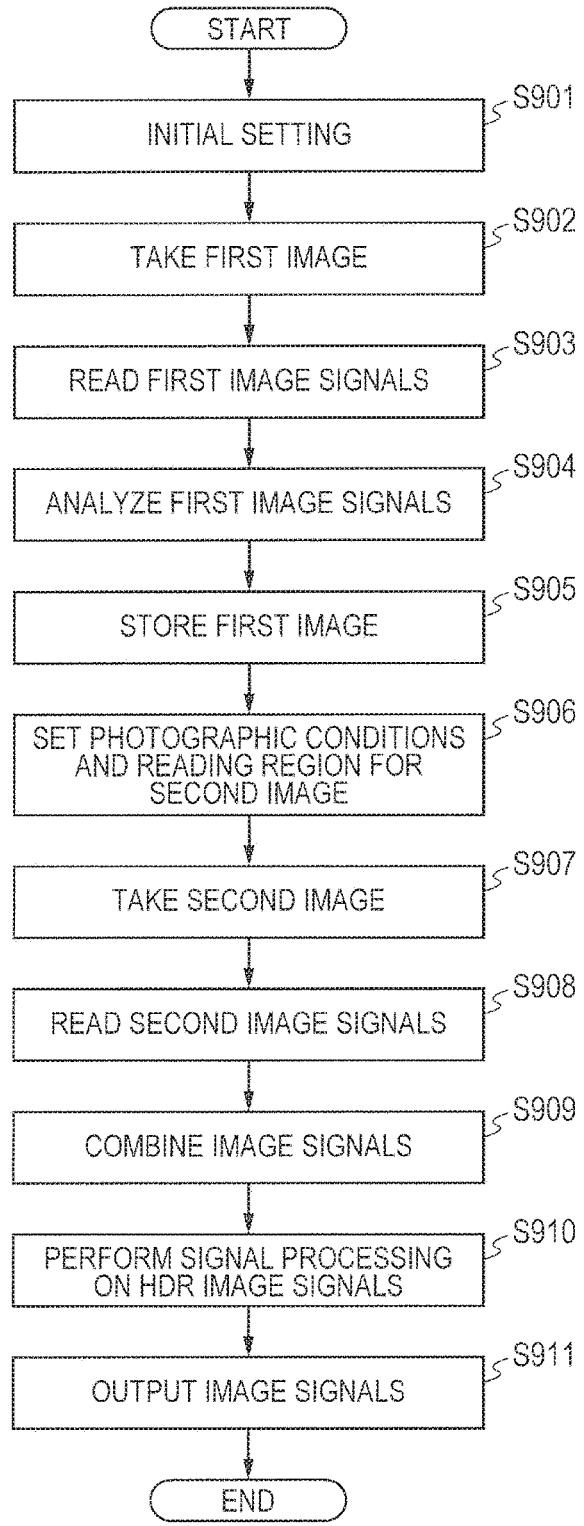
FIG. 9 is a flow chart for illustrating an operation during the HDR photography in the image pickup apparatus according to the second embodiment.

Next, an operation during HDR photography of the image pickup apparatus 309 according to this embodiment is described in detail with reference to FIG. 9. Operation during normal photography in the image pickup apparatus 309 according to this embodiment is similar to the operation during the normal photography in the image pickup apparatus 309 according to the first embodiment, which has been described above with reference to FIG. 5, and hence a description thereof is omitted. FIG. 9 is a flow chart for illustrating the operation during the HDR photography of the image pickup apparatus 309 according to this embodiment. Also in this embodiment, as in the first embodiment, photography is performed two times under different photographic conditions to acquire the first image 801 and the second image 802. Then, the first image 801 and the second image 802 are combined in the solid-state image pickup element 302 to generate the HDR image.

First, Steps S901 to S905 are similar to Steps S501 to S505, which have been described above with reference to FIG. 6, and hence a description thereof is omitted.

Next, based on a result of analysis of the first image 801 by the signal level analysis part 205, photographic conditions and a reading region for acquiring the second image are set (Step S906). Specifically, based on the analysis result of the first image by the signal level analysis part 205, exposure time in acquiring the second image is set by the controller 103, for example. Photographic conditions for acquiring the second image are not limited only to setting of charge accumulation period. As described above in the first embodiment, the setting of the charge accumulation period, setting of a gain in the A/D converter 105, and other such settings may be combined as appropriate to set the photographic conditions for acquiring the second image. The reading region in acquiring the second image is set as follows. Specifically, the first image 801 is analyzed by the signal level analysis part 205. More specifically, signals from the respective unit pixels 601 are analyzed by the signal level analysis part 205. Then, based on a result of the analysis by the signal level analysis part 205, a region including unit pixels 601 having signal levels that are a predetermined level or more is set as the reading region. Specifically, a region including a region in which the unit pixels 601 having the signal levels that are the predetermined level or more are located and a surrounding region thereof is set as the reading region. For example, as in the second image 802 illustrated in FIG. 8B, a rectangular region including the unit pixels 601 having the signal levels that are the predetermined level or more is set as the reading region. When the reading region is set in this manner, in reading of the second image signal (Step S908) to be described later, the following operation is performed. Specifically, selection of rows to be read by the vertical selection circuit 602 and selection of columns to be read by the horizontal selection circuit 603 are combined to read signals from the unit pixels 601 located in the reading region. The reading region is a rectangular region because the rows to be read and the columns to be read are limited to define the reading region.

Next, based on the photographic conditions set in Step S906, the second image is taken (Step S907). The second image is taken at a timing that is different from a timing when the first image is taken. Next, the signals that have been read from the unit pixels 601 located in the reading region set in Step S906 and have been subjected to A/D conversion are read as a second image signal by the signal processing unit 108 (Step S908).

Next, the thus-read second image signal and the first image signal held in the memory 109 are combined by the image signal combining part 206, to thereby generate an HDR image (Step S909). Next, various kinds of signal processing are performed on the thus-obtained HDR image signal (Step S910). Specifically, the signals are amplified by the signal amplifier 201, and a reference level is adjusted by the reference level adjustment part 202. Further, the defect correction is performed by the correction part 203, and the white balance adjustment and development processing are performed by the development processing part 204. Then, the image signals output from the signal processing unit 108 are output to the recording unit 305 or the display 308, which is located outside the solid-state image pickup element 302, via the output part 110 (Step S911). This completes the acquisition of the HDR image.

As described above, according to this embodiment, when the second image is read, it is not that signals from all unit pixels 601 provided in the light receiving portion 104 are read, but that signals are read only from unit pixels 601 located in a partial region of the light receiving portion 104. Therefore, according to this embodiment, the reading time for the second image may be reduced, and hence the time required to acquire the HDR image may be reduced further.

Third Embodiment

A solid-state image pickup element and an image pickup apparatus according to a third embodiment of the present invention are described with reference to the drawings. Components like those of the solid-state image pickup element and the image pickup apparatus according to the first or second embodiment, which are illustrated in FIG. 1 to FIG. 9, are denoted by like reference symbols, and a description thereof is omitted or briefly made.

In the solid-state image pickup element 302 according to this embodiment, the signals from the unit pixels 601 provided on the substrate 101 side are directly input to the substrate 102 side. A basic configuration of the image pickup apparatus 309 according to this embodiment is similar to the basic configuration of the image pickup apparatus 309 according to the first embodiment, which has been described above with reference to FIG. 4.

Figure 10:
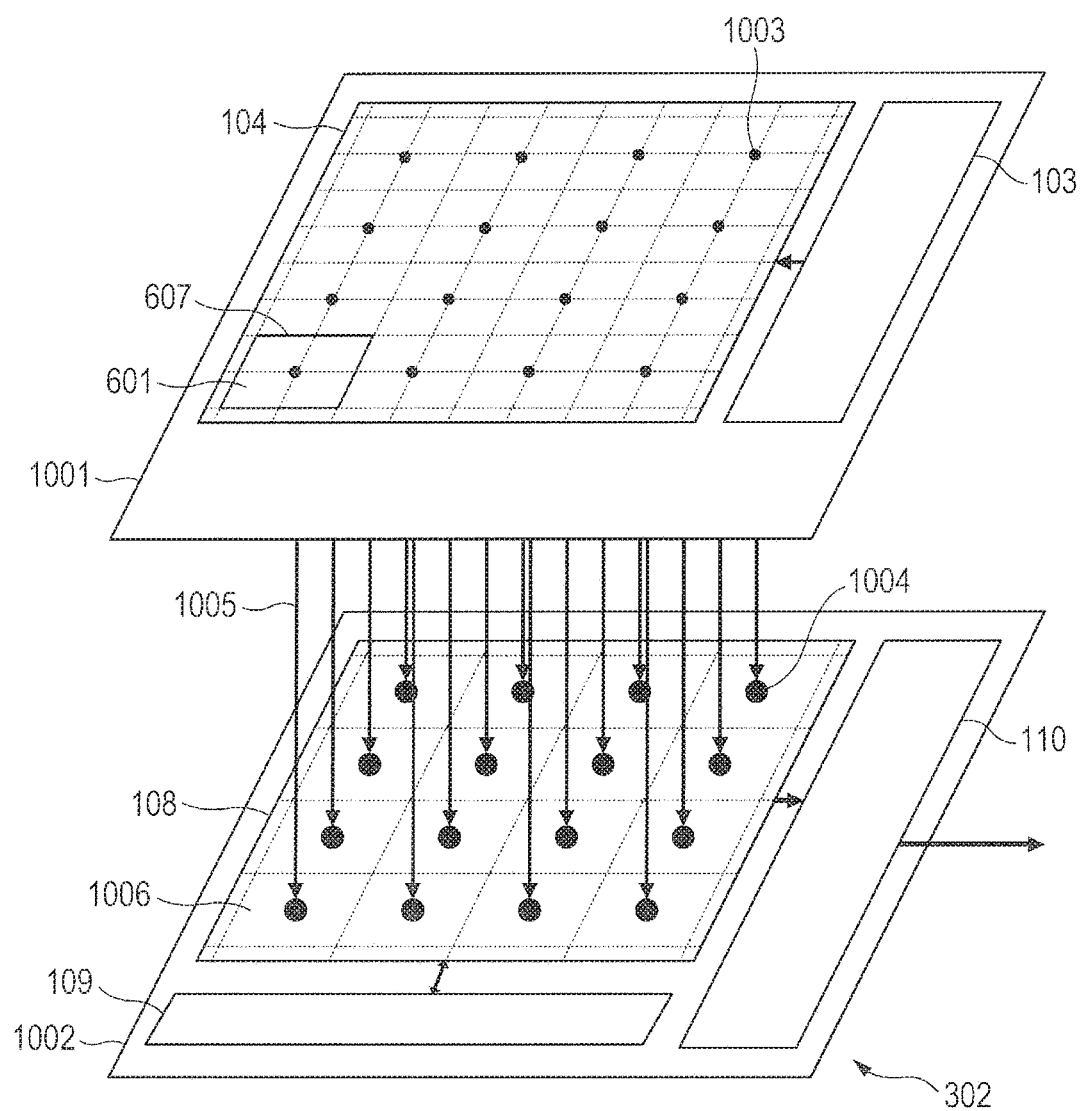
FIG. 10 is a schematic diagram for illustrating a solid-state image pickup element according to a third embodiment.

FIG. 10 is a schematic diagram for illustrating the solid-state image pickup element 302 according to this embodiment. As illustrated in FIG. 10, the solid-state image pickup element 302 according to this embodiment has the structure in which a substrate 1001 is laminated on a substrate 1002.

The substrate 1001 includes the light receiving portion 104, connection portions 1003, and the controller 103. In the light receiving portion 104, the plurality of unit pixels 601 are two-dimensionally arranged in the row direction and the column direction. The connection portions 1003 are configured to transfer the signals from the light receiving portion 104 to the substrate 1002. In this example, one connection portion 1003 is assigned to one pixel block 607 including two by two, that is, four unit pixels 601. In other words, four unit pixels 601 share one connection portion 1003. The controller 103 is configured to control the light receiving portion 104.

The substrate 1002 includes connection portions 1004, the signal processing unit 108, the memory 109, and the output part 110. The connection portions 1004 are configured to receive the image signals from the substrate 1001. The signal processing unit 108 includes a plurality of partial signal processing parts 1006. One partial signal processing part 1006 is assigned to one pixel block 607 including two by two, that is, four unit pixels 601. The signal processing unit 108 is configured to perform A/D conversion, which is processing for converting analog pixel signals input from the substrate 1001 side via the connection portions 1004 into digital pixel signals. The signal processing unit 108 is also configured to perform various kinds of image processing on the image signals input from the substrate 1001 side via the connection portions 1004 and the image signals from the memory 109. Examples of the image processing include signal amplification, reference level adjustment, defect correction, and development processing. The signal processing unit 108 is also configured to combine a plurality of taken images to generate an HDR image. The memory 109 is configured to temporarily hold the image signals from the signal processing unit 108. The output part 110 is configured to output the image signals, which are output from the signal processing unit 108, to the outside of the solid-state image pickup element 302.

The plurality of connection portions 1003 provided on the substrate 1001 side and the plurality of connection portions 1004 provided on the substrate 1002 side are electrically joined via through electrodes 1005, respectively. As the through electrodes 1005, through silicon vias (hereinafter referred to as TSV) or the like are used, for example.

Figure 11:
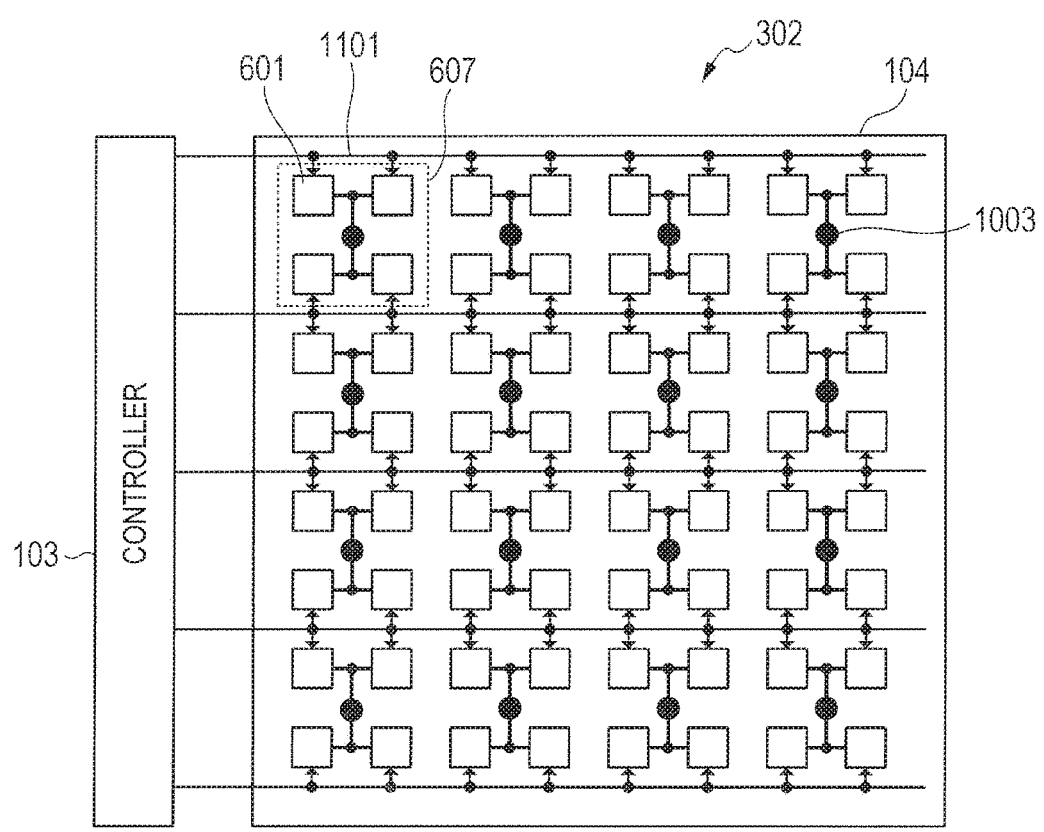
FIG. 11 is a circuit diagram for illustrating the solid-state image pickup element according to the third embodiment.

FIG. 11 is a circuit diagram for illustrating the solid-state image pickup element 302 according to this embodiment. In FIG. 11, a circuit on the substrate 1001 side is illustrated. As illustrated in FIG. 11, on the substrate 1001, the light receiving portion 104 in which the plurality of unit pixels 601 are arranged in matrix, the controller 103, and a driving signal line 1101 are provided. The controller 103 is configured to apply driving pulses to the respective unit pixels 601 via the driving signal line 1101 as appropriate. In this example, for simplicity, one driving signal line 1101 is illustrated for each line or every two lines, but in reality, the number of driving signal lines 1101 appropriate to drive the respective unit pixels 601 are provided as appropriate. Moreover, as described above, one connection portion 1003 is assigned to the pixel block 607 including two by two, that is, four unit pixels 601.

The controller 103 is configured to perform appropriate control such that a signal generated by a unit pixel 601 is not mixed with a signal generated by another unit pixel 601 sharing the connection portion 1003 with the unit pixel 601. Signals generated by the plurality of unit pixels 601 sharing the connection portion 1003 are sequentially output to the substrate 1102 side under the control of the controller 103. In FIG. 11, in order to simplify the description, unit pixels 601 in 8 rows by 8 columns are illustrated, but in reality, unit pixels 601 in several thousands of rows by several thousands of columns are arranged.

Figure 12:
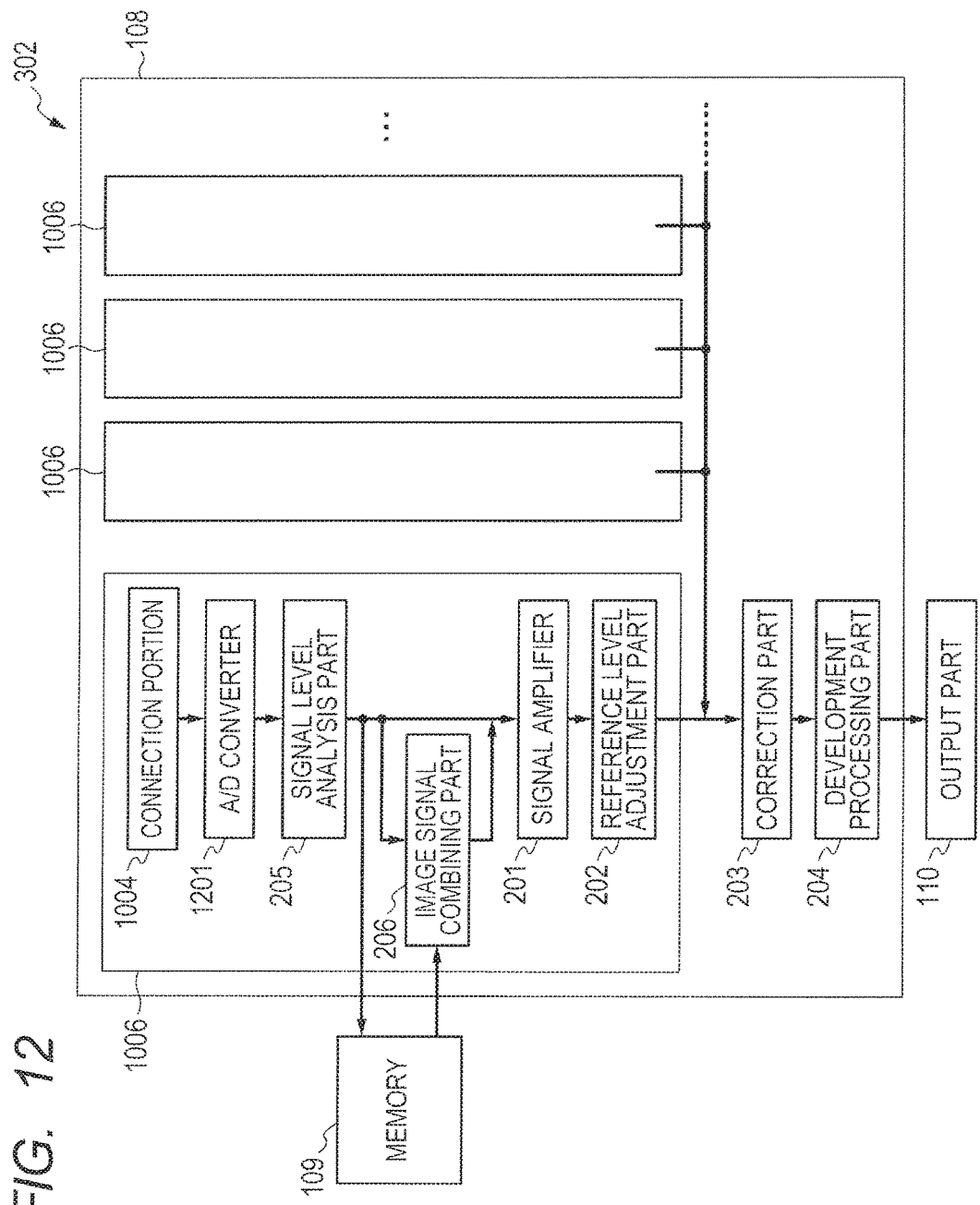
FIG. 12 is a block diagram for illustrating a signal processing unit of the solid-state image pickup element according to the third embodiment.

FIG. 12 is a block diagram for illustrating a configuration of the signal processing unit 108 of the solid-state image pickup element 302 according to this embodiment. As illustrated in FIG. 12, the signal processing unit 108 includes the plurality of partial signal processing parts 1006, the correction part 203, and the development processing part 204. One partial signal processing part 1006 is assigned to one pixel block 607 including two by two, that is, four unit pixels 601. In other words, four unit pixels 601 share one partial signal processing part 1006. In each of the partial signal processing parts 1006, the connection portion 1004, an A/D converter 1201, the signal level analysis part 205, the image signal combining part 206, the signal amplifier 201, and the reference level adjustment part 202 are provided. The A/D converter 1201 is configured to convert analog image signals input from the unit pixels 601 via the connection portion 1004 into digital image signals. The signal level analysis part 205, the image signal combining part 206, the signal amplifier 201, and the reference level adjustment part 202 have been described above in the first embodiment with reference to FIG. 3, and hence a description thereof is omitted. Each of the partial signal processing parts 1006 is configured to perform various kinds of signal processing on the image signals input from the plurality of unit pixels 601. The plurality of image signals on which the various kinds of signal processing have been performed are collectively input from the plurality of partial signal processing parts 1006 to the correction part 203. Various kinds of correction processing, which are performed by the correction part 203, and development processing, which is performed by the development processing part 204, are collectively performed on the plurality of image signals input from the plurality of partial signal processing parts 1006.

FIG. 13A to FIG. 13C are drawings for illustrating examples of images acquired during the HDR photography by the image pickup apparatus according to this embodiment. In FIG. 13A, there is illustrated an example of a first image 1301, that is, an image acquired in the first photography, and in FIG. 13B, there is illustrated an example of a second image 1302, that is, an image acquired in the second photography. In FIG. 13C, there is illustrated an example of an HDR image 1303 obtained by combining the first image 1301 and the second image 1302.

The first image 1301 illustrated in FIG. 13A is an image acquired under initially-set photographic conditions, and is an image similar to the first image 701, which has been described above with reference to FIG. 7A in the first embodiment.

The second image 1302 illustrated in FIG. 13B is an image under settings of such photographic conditions that, even in a region having signal levels reaching a saturation level in the first image 1301 illustrated in FIG. 13A, the signal levels do not reach the saturation level. In this embodiment, the partial signal processing part 1006 is provided for each pixel block 607, and hence the images may be combined in a small area. Therefore, according to this embodiment, the area from which the signals are read in acquiring the second image may be set more finely, and the number of image signals that are read in acquiring the second image may be reduced. Therefore, according to this embodiment, the reading time for the second image signal may be reduced further, and hence the HDR image may be acquired at even higher speed.

The HDR image 1303 illustrated in FIG. 13C is the image obtained by combining the first image 1301 illustrated in FIG. 13A and the second image 1302 illustrated in FIG. 13B. For the region including the region having the signal levels reaching the saturation level in the first image 1301 and the surrounding region thereof, image signals are generated by combining the first image 1301 and the second image 1302. For regions other than the region, image signals are generated by multiplying image signals of the first image 1301 by an appropriate gain or the like.

As described above, the signals from the unit pixels 601 provided on the substrate 1001 side may be directly input to the substrate 1002 side.

Modified Embodiment

The present invention is not limited to the above-mentioned embodiments, and various modifications may be made thereto.

For example, in the above-mentioned embodiments, there has been described, as an example, the case where the photographic conditions for acquiring the second image are set based on the analysis result of the first image, but the present invention is not limited thereto. The photographic conditions for acquiring the second image may be set without being based on the result of the analysis of the first image. For example, without acquiring the first image, the photographic conditions for acquiring the second image may be set such that an exposure amount for acquiring the first image and an exposure amount for acquiring the second image are different to a certain extent.

Moreover, in the second embodiment, as illustrated in FIG. 8B, the reading region has been defined by limiting the area of rows to be read and the area of columns to be read, but the present invention is not limited thereto. The reading region may be defined by limiting only the rows to be read, or the reading region may be defined by limiting only the columns to be read. When the reading region is defined by limiting only the rows to be read, the following operation is performed. Specifically, a vertical selection start address and a vertical selection end address for acquiring the second image are determined by the controller 103. When the second image signal is read, driving signal lines 604 from a row corresponding to the vertical selection start address to a row corresponding to the vertical selection end address are activated sequentially by the vertical selection circuit 602. Then, signals from unit pixels 601 are read sequentially by the signal processing unit 108. The reading region may be defined by limiting only the rows to be read, and hence control may be simplified. Alternatively, when the reading region is defined by limiting only the columns to be read, the following operation is performed. Specifically, a horizontal selection start address and a horizontal selection end address are determined by the controller 103. When the second image signal is read, driving signal lines 604 are activated sequentially by the vertical selection circuit 602, and signals in an area from the horizontal selection start address to the horizontal selection end address are read. The reading region may be defined by limiting only the columns to be read, and hence control may be simplified also in this case.

Moreover, in the above-mentioned embodiments, there has been described, as an example, the case where the photographic conditions for acquiring the second image are set such that the signal levels in the second image become lower than the signal levels in the first image, but the present invention is not limited thereto. For example, the photographic conditions for acquiring the second image may be set such that the signal levels in the second image become higher than the signal levels in the first image. For example, when there is a portion having a predetermined signal level or less in the first image, the second image is acquired under such photographic conditions that the signal levels in the second image become higher than the signal levels in the first image. In this manner, there may be obtained an HDR image in which insufficient gradation in a dark portion is improved. In this case, in the second and third embodiments, an area of the first image signal including unit pixels 601 having signal levels that are the predetermined level or less is determined as the reading area in which the unit pixels 601 are read when the second image signal is acquired.

Moreover, in the third embodiment, there has been described, as an example, the case where two by two, that is, four unit pixels 601 are included in one pixel block 607, but the number of pixels 601 included in one pixel block 607 is not limited to four. For example, the number of unit pixels 601 included in one pixel block 607 may be five or more, or three or less. For example, one partial signal processing part 1006 may be assigned to one unit pixel 601.

Moreover, in the above-mentioned embodiments, there has been described, as an example, the case where the photographic conditions for acquiring the second image are the same for all unit pixels 601, but the present invention is not limited thereto. For example, the charge accumulation period is set to a first period for unit pixels 601 located in a first portion of the second image. Then, the charge accumulation period may be set to a second period, which is different from the first period, for unit pixels 601 located in a second portion, which is different from the first portion, in the second image. In the solid-state image pickup element 302 according to the third embodiment, the signal processing may be performed for each pixel block 607, and hence the photographic conditions for acquiring the second image may be set for each pixel block 607. When the photographic conditions for acquiring the second image are different for respective portions in the light receiving portion 104 as appropriate, a more satisfactory HDR image may be obtained.

Moreover, in the above-mentioned embodiments, there has been described, as an example, the case where the HDR image is generated by image combination of the first image and the second image, which are acquired by performing photography two times, but the present invention is not limited thereto. For example, an HDR image may be generated by combining three or more images acquired by performing photography three or more times.

Moreover, in the above-mentioned embodiments, there has been described, as an example, the case where the photographic conditions for acquiring the first image and the photographic conditions for acquiring the second image are set to be different from each other by setting the charge accumulation periods and the gains in the solid-state image pickup element 302 to be different from each other, but the present invention is not limited thereto. For example, the photographic conditions for acquiring the first image and the photographic conditions for acquiring the second image may be set to be different from each other by setting periods in which a shutter is open, that is, exposure time to be different from each other. Alternatively, the photographic conditions for acquiring the first image and the photographic conditions for acquiring the second image may be set to be different from each other by setting aperture amounts of a diaphragm to be different from each other.

Moreover, in the above-mentioned embodiments, there has been described, as an example, the solid-state image pickup element 302 in which the substrate 101, 1001 and the substrate 102, 1002 are laminated, but the present invention is not limited thereto. For example, all constituting elements, such as the light receiving portion 104 and the signal processing unit 108, may be included on one substrate. Moreover, the solid-state image pickup element 302 may be formed by laminating three or more substrates. Moreover in the above-mentioned embodiments, there has been described, as an example, the case where all of the various kinds of image processing are performed by the signal processing unit 108 provided in the solid-state image pickup element 302, but the present invention is not limited thereto. For example, an image processing element (not shown) may be provided separately from the solid-state image pickup element 302, and the various kinds of image processing may be shared by the signal processing unit 108, which is provided in the solid-state image pickup element 302, and the image processing element, which is provided outside the solid-state image pickup element 302.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-256094, filed Dec. 28, 2015 which is hereby incorporated by reference herein in its entirety.

What is claimed is:

1. A solid-state image pickup element, comprising:
a pixel portion in which a plurality of pixels are arranged; and
at least one processor, included in the solid-state image pickup element, programmed to function as:
an image signal combining part which combines a first image signal read from the pixel portion at a first timing, and a second image signal read from the pixel portion at a second timing, which is different from the first timing, to generate a third image signal;
a signal level analysis part which analyzes a signal level of the first image signal;
a memory which stores the first image signal; and
a controller which controls the signal, level of the first image signal and a signal level of the second image signal to be different from each other based on a result of the analysis of the first image signal by the signal level analysis part,
wherein the image signal combining part generates the third image signal by combining the second image signal read from the pixel portion with the first image signal stored in the memory, and
wherein the third image signal has a ratio between a minimum expressible luminance and a maximum expressible luminance that is larger than that of the first image signal and that of the second image signal.

2. The solid-state image pickup element according to claim 1, further comprising an analog-to-digital converter which performs analog-to-digital conversion on a signal from the pixel,
wherein the first image signal and the second image signal are digital image signals after being subjected to the analog-to-digital conversion by the analog-to-digital converter.

3. The solid-state image pickup element according to claim 1, wherein the controller determines an area including the pixel having the signal level that is one of a predetermined level or more and the predetermined level or less in the first image signal, as a reading area in which the pixel is read in a case where the second image signal is acquired.

4. The solid-state image pickup element according to claim 1, further comprising:
a first substrate; and
a second substrate arranged on the first substrate,
wherein the image signal combining part is arranged on the first substrate, and the pixel portion is arranged on the second substrate.

5. The solid-state image pickup element according to claim 1, wherein the controller controls the signal level of the second image signal based on the result of the analysis by the signal level analysis part.

6. The solid-state image pickup element according to claim 1, wherein the controller determines the pixels to be read when the second image signal is acquired based on the result of the analysis of the first image signal by the signal level analysis part.

7. The solid-state image pickup element according to claim 1, wherein
the image signal combining part generates the third image signal by combining image signals acquired at three or more different timings.

8. The solid-state image pickup element according to claim 1, further comprising a plurality of substrates stacked on each other,
wherein the image signal combining part is arranged on a substrate different from a substrate on which the pixel portion is arranged.

9. The solid-state image pickup element according to claim 1, wherein
the controller controls the signal levels of the first image signal and the second image signal to differ by making at least one of accumulation time, exposure time and an amplification factor different.

10. An image pickup apparatus, comprising:
a solid-state image pickup element, including:
a pixel portion in which a plurality of pixels are arranged; and
at, least one processor, included in the solid-state image pickup element, programmed to function as:
an image signal combining part which combines a first image signal read from the pixel portion at a first timing, and a second image signal read from the pixel portion at a second timing, which is different from the first timing, to generate a third image signal;
a signal level analysis part which analyzes a signal level of the first image signal; and
a memory which stores the first image signal;
a controller which controls the signal level of the first imago signal and a signal level of the second image signal to be different from each other based on a result of the analysis of the first image signal by the signal level analysis part; and
a display which displays an image taken by the solid-state image pickup element,
wherein the image signal combining part generates the third image signal by combining the second image signal read from the pixel portion with the first image signal stored in the memory, and
wherein the third image signal has a ratio between a minimum expressible luminance and a maximum expressible luminance that is larger than that of the first image signal and that of the second image signal.

11. The solid-state image pickup element according to claim 1, wherein
the third image signal has a dynamic range of an object to be photographed wider than that of the first image signal or the second image signal.

12. The solid-state image pickup element according to claim 1, wherein
the image signal combining part generates the third image signal by combining image signals acquired at two different timings.

* * * * *